US011074376B2

(12) United States Patent
Cheng et al.

(10) Patent No.: US 11,074,376 B2
(45) Date of Patent: Jul. 27, 2021

(54) METHOD FOR ANALYZING PROCESS OUTPUT AND METHOD FOR CREATING EQUIPMENT PARAMETER MODEL

(71) Applicant: UNITED MICROELECTRONICS CORP., Hsinchu (TW)

(72) Inventors: Ya-Ching Cheng, Hsinchu (TW); Chun-Liang Hou, Zhubei (TW); Chien-Hung Chen, Xinpu Township (TW); Wen-Jung Liao, Hsinchu (TW); Min-Chin Hsieh, Zhubei (TW); Da-Ching Liao, Taichung (TW); Li-Chin Wang, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 905 days.

(21) Appl. No.: 15/497,489

(22) Filed: Apr. 26, 2017

(65) Prior Publication Data

US 2018/0314773 A1   Nov. 1, 2018

(51) Int. Cl.
*G06F 30/20* (2020.01)
(52) U.S. Cl.
CPC .................................. *G06F 30/20* (2020.01)
(58) Field of Classification Search
CPC ....................................................... G06F 30/20
See application file for complete search history.

(56) References Cited

U.S. PATENT DOCUMENTS

| 2008/0127027 A1* | 5/2008 | Gallatin | G03F 1/36 716/52 |
| 2014/0100684 A1* | 4/2014 | Lin | G03F 7/70616 700/110 |
| 2014/0222376 A1* | 8/2014 | Kao | G05B 19/41875 702/182 |

FOREIGN PATENT DOCUMENTS

CN           105628646 A        6/2016

* cited by examiner

*Primary Examiner* — Bijan Mapar
(74) *Attorney, Agent, or Firm* — WPAT, PC (57) ABSTRACT

A method for analyzing a process output and a method for creating an equipment parameter model are provided. The method for analyzing the process output includes the following steps: A plurality of process steps are obtained. A processor obtains a step model set including a plurality of first step regression models, each of which represents a relationship between N of the process steps and a process output. The processor calculates a correlation of each of the first step regression models. The processor picks up at least two of the first step regression models to be a plurality of second step regression models whose correlations are ranked at top among the correlations of the first step regression models. The processor updates the step model set by a plurality of third step regression models, each of which represents a relationship between M of the process steps and the process output.

20 Claims, 9 Drawing Sheets

METHOD FOR ANALYZING PROCESS OUTPUT AND METHOD FOR CREATING EQUIPMENT PARAMETER MODEL

TECHNICAL FIELD

The disclosure relates in general to a method for analyzing a process output and a method for creating an equipment parameter model.

BACKGROUND

According to the development of technology, various complex electric devices are invented. The electric device may be manufactured by several complex process steps, such as several semiconductor process steps, several packing process steps, and several assembly process steps. For improving the yield rate, the key process steps must be found.

Furthermore, during the manufacturing process, a complex equipment which is set by a lot of parameters may be used. For accurately performing the process step by this equipment, an equipment parameter model is needed to be created.

SUMMARY

The disclosure is directed to a method for analyzing a process output and a method for creating an equipment parameter model.

According to one embodiment, a method for analyzing a process output is provided. The method includes the following steps: A plurality of process steps are obtained from a database or an inputting device. A processor obtains a step model set including a plurality of first step regression models, each of which represents a relationship between N of the process steps and a process output. N is a natural number. The processor calculates a correlation of each of the first step regression models. The processor picks up at least two of the first step regression models to be a plurality of second step regression models whose correlations are ranked at top among the correlations of the first step regression models. The processor updates the step model set by a plurality of third step regression models, each of which represents a relationship between M of the process steps and the process output. M=N+1. The M of the process steps in one of the third step regression models include the N of the process steps in one of the second step regression models. The step of picking up at least two of the first step regression models, the step of updating the step model set and the step calculating the correlations of the first step regression models are repeatedly performed until a convergence condition is satisfied.

According to another embodiment, a method for creating an equipment parameter model is provided. The method includes the following steps: A plurality of equipment parameters are obtained from a database or an inputting device. A processor obtains a parameter model set including a plurality of first parameter regression models, each of which represents a relationship between P of the equipment parameters and an equipment output. P is a natural number. The processor calculates a correlation of each of the first parameter regression models. The processor picks up at least two of the first parameter regression models to be a plurality of second parameter regression models whose correlations are ranked at top among the correlations of the first parameter regression models. The processor updates the parameter model set by a plurality of third parameter regression models, each of which represents a relationship between Q of the equipment parameters and the equipment output. Q=P+1. The Q of the equipment parameters in one of the third parameter regression models include the P of the equipment parameters in one of the second parameter regression models. The processor creates the equipment parameter model according to the parameter model set. The step of picking up at least two of the first parameter regression models, the step of updating the parameter model set and the step of calculating the correlations of the first parameter regression models are repeatedly performed until a convergence condition is satisfied.

According to another embodiment, a method for creating an equipment parameter model is provided. The method includes the following steps. A plurality of equipment parameters are obtained from a database or an inputting device. A processor obtains a plurality of inputting factors by setting an exponent of each of the equipment parameters or multiplying at least two of the equipment parameters. The processor creates the equipment parameter model which represents a relationship between the inputting factors and an equipment output.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

First Embodiment

Figure 1:
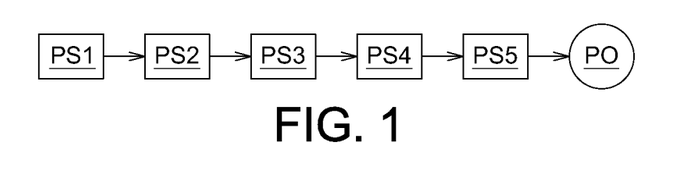
FIG. 1 shows an exemplified manufacturing process.

Please refer to FIG. 1, which shows an exemplified manufacturing process. One device may be manufactured by quite a lot of process steps. In this simplified example, one device is manufactured by five process steps PS1, PS2, PS3, PS4 and PS5. After performing the manufacturing process, a process output PO is obtained. For example, in each of the process steps PS1, PS2, PS3, PS4, PS5, an apparatus, a procedure, a chamber or a recipe may be set. The process output PO may be a yield rate, a critical dimension, a defect value, an inspection, a metrology, a monitor data of wafer or equipment, a result of Wafer Acceptance Test (WAT) or at least one item of the WAT.

Figure 2:
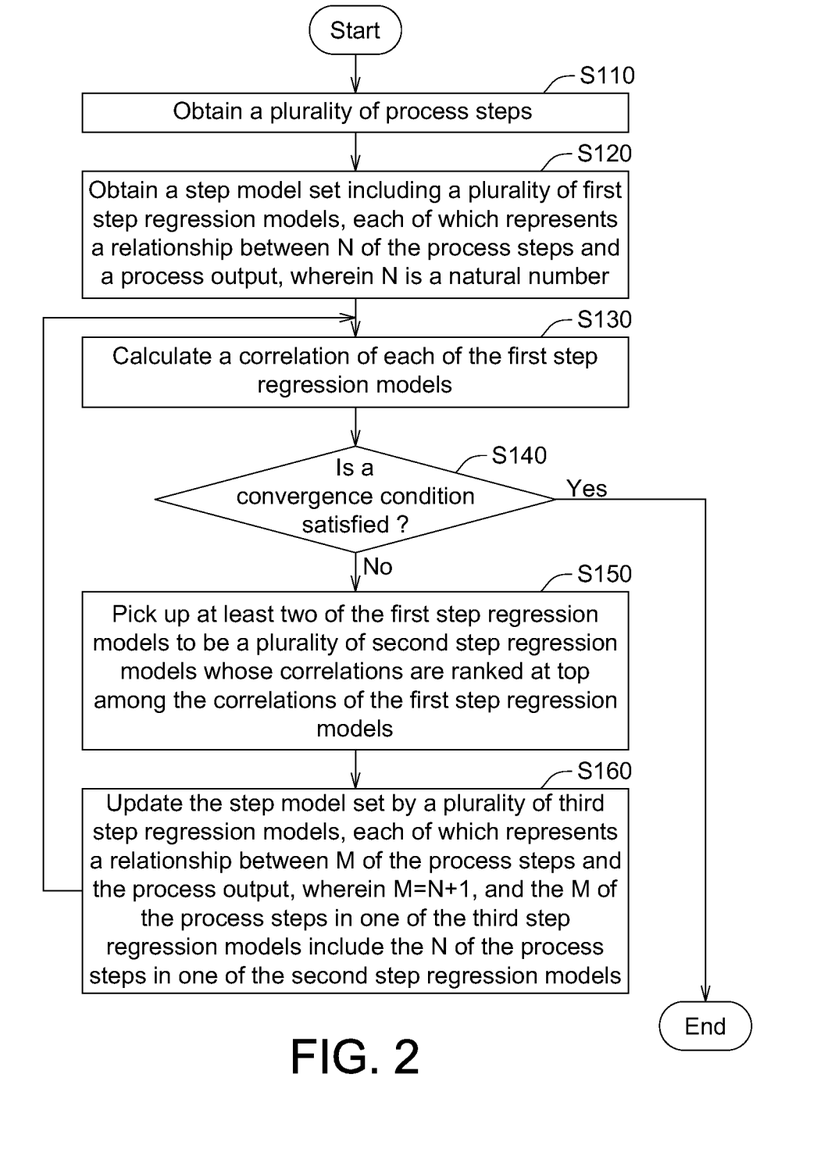
FIG. 2 shows a flowchart of a method for analyzing a process output according to a first embodiment of the present invention.

Please refer to FIG. 2 and FIGS. 3A to 3D. FIG. 2 shows a flowchart of a method for analyzing the process output according to the first embodiment of the present invention. FIGS. 3A to 3D illustrate the steps of FIG. 2. In this embodiment, the method for analyzing the process output is a semi best subset (SBS) algorithm.

In step S110, a plurality of process steps are obtained from a database or an inputting device. As shown in FIG. 1, the process steps PS1, PS2, PS3, PS4, PS5 are obtained.

Figure 3A:
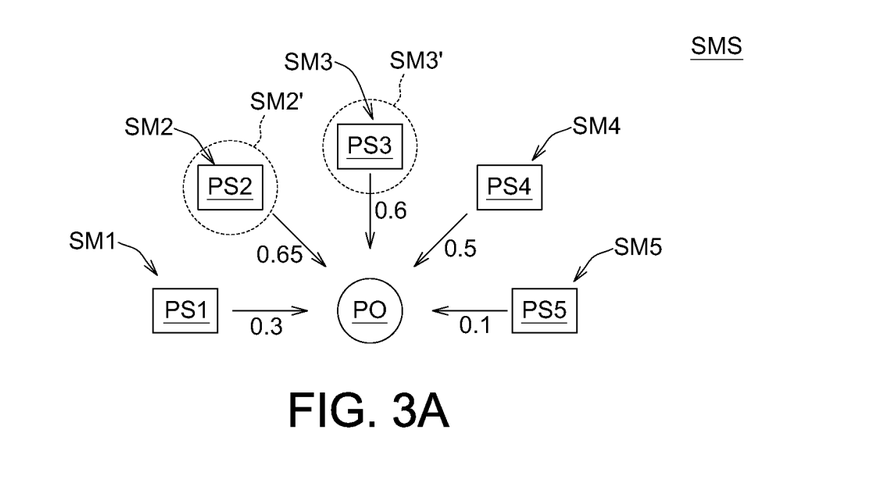
FIGS. 3A to 3D illustrate steps of FIG. 2.

Next, in step S120, a processor obtains a step model set including a plurality of first step regression models. As shown in FIG. 3A, the processor obtains a step model set SMS including a plurality of step regression models SM1, SM2, SM3, SM4, SM5. The step regression model SM1 represents a relationship between the process step PS1 and the process output PO. The step regression model SM2 represents a relationship between the process step PS2 and the process output PO. The step regression model SM3 represents a relationship between the process step PS3 and the process output PO. The step regression model SM4 represents a relationship between the process step PS4 and the process output PO. The step regression model SM5 represents a relationship between the process step PS5 and the process output PO.

Afterwards, in step S130, the processor calculates a correlation of each of the first step regression models. In this example, the processor calculates a correlation of each of the step regression models SM1, SM2, SM3, SM4, SM5. For example, each of the correlations may be a R-squared value, an adjusted R-squared value, a Mallow' Cp statistic value or a P-value. Referring to table I, the correlations of the step regression models SM1, SM2, SM3, SM4, SM5 are shown.

TABLE I

| Step regression model | Process step | R-squared value | Rank | Pick up? |
|---|---|---|---|---|
| SM1 | PS1 | 0.30 | 4 | No |
| SM2 | PS2 | 0.65 | 1 | Yes |
| SM3 | PS3 | 0.60 | 2 | Yes |
| SM4 | PS4 | 0.50 | 3 | No |
| SM5 | PS5 | 0.10 | 5 | No |

Afterwards, in step S140, the processor determines whether a convergence condition is satisfied. If the convergence condition is satisfied, then the process is terminated; if the convergence condition is not satisfied, then the process proceeds to step S150. That is to say, the step S150, the step S160 and the step S130 are repeatedly performed until the convergence condition is satisfied.

In one embodiment, the convergence condition is that a variation of the correlations is less than a predetermined value.

As shown in FIG. 3A, the convergence condition is not satisfied. So, the process proceeds to step S150.

In step S150, the processor picks up at least two of the first step regression models to be a plurality of second step regression models. As shown in FIG. 3A, the processor picks up two step regression models SM2', SM3'. The correlations of the step regression models SM2', SM3' are ranked at top among the correlations of the step regression models SM1, SM2, SM3, SM4, SM5.

In this example, the correlations of the step regression models SM2', SM3' are ranked at top predetermined percentage or top predetermined number, such as two, among the correlations of the step regression models SM1, SM2, SM3, SM4, SM5. The predetermined percentage and the predetermined number may be set according to the correlations of the step regression models SM1, SM2, SM3, SM4, SM5.

Figure 3B:
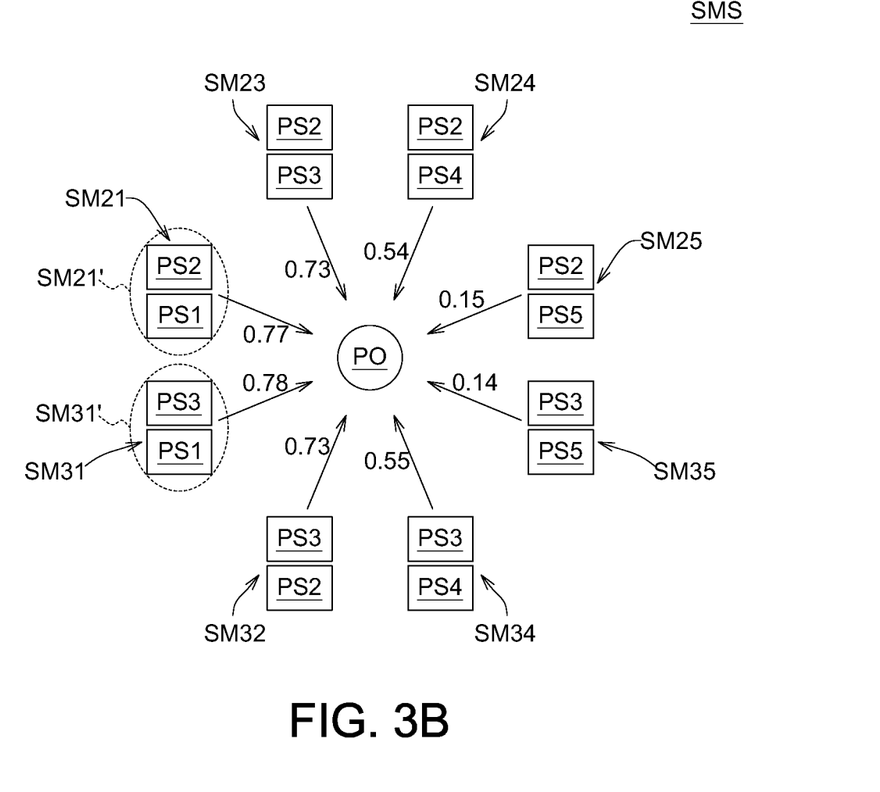

In step S160, the processor updates the step model set by a plurality of third step regression models. As shown in FIG. 3B, the step model set SMS is updated by a plurality of step regression models SM21, SM23, SM24, SM25, SM31, SM32, SM34, SM35. The step regression model SM21 represents a relationship between the process steps PS1, PS2 and the process output PO. The step regression model SM23 represents a relationship between the process steps PS2, PS3 and the process output PO. The step regression model SM24 represents a relationship between the process steps PS2, PS4 and the process output PO. The step regression model SM25 represents a relationship between the process steps PS2, PS5 and the process output PO. The step regression model SM31 represents a relationship between the process steps PS3, PS1 and the process output PO. The step regression model SM32 represents a relationship between the process steps PS3, PS2 and the process output PO. The step regression model SM34 represents a relationship between the process steps PS3, PS4 and the process output PO. The step regression model SM35 represents a relationship between the process steps PS3, PS5 and the process output PO.

In one example, the number of the process steps may be quite large, so the step model set may be just updated by part of the third step regression models. In the step S160, the third step regression models may be sequentially formed until a stopping condition is satisfied. Then, the step model set is updated by the third step regression models which are already formed.

Then, in step S130, as shown in table II, the processor calculates a correlation of each of the step regression models SM21, SM23, SM24, SM25, SM31, SM32, SM34, SM35.

TABLE II

| Step regression model | Process steps | R-squared value | Rank | Pick up? |
|---|---|---|---|---|
| SM21 | PS2 PS1 | 0.77 | 2 | Yes |
| SM23 | PS2 PS3 | 0.73 | 3 | No |
| SM24 | PS2 PS4 | 0.54 | 6 | No |
| SM25 | PS2 PS5 | 0.15 | 7 | No |
| SM31 | PS3 PS1 | 0.78 | 1 | Yes |
| SM32 | PS3 PS2 | 0.73 | 3 | No |
| SM34 | PS3 PS4 | 0.55 | 5 | No |
| SM35 | PS3 PS5 | 0.14 | 8 | No |

Next, in step S140, the convergence condition is not satisfied, so the process proceeds to step S150 again.

Then, in step S150, as shown in FIG. 3B, the processor picks up two step regression models SM21', SM31'. The correlations of the step regression models SM21', SM31' are ranked at top among the correlations of the step regression models SM21, SM23, SM24, SM25, SM31, SM32, SM34, SM35.

Figure 3C:
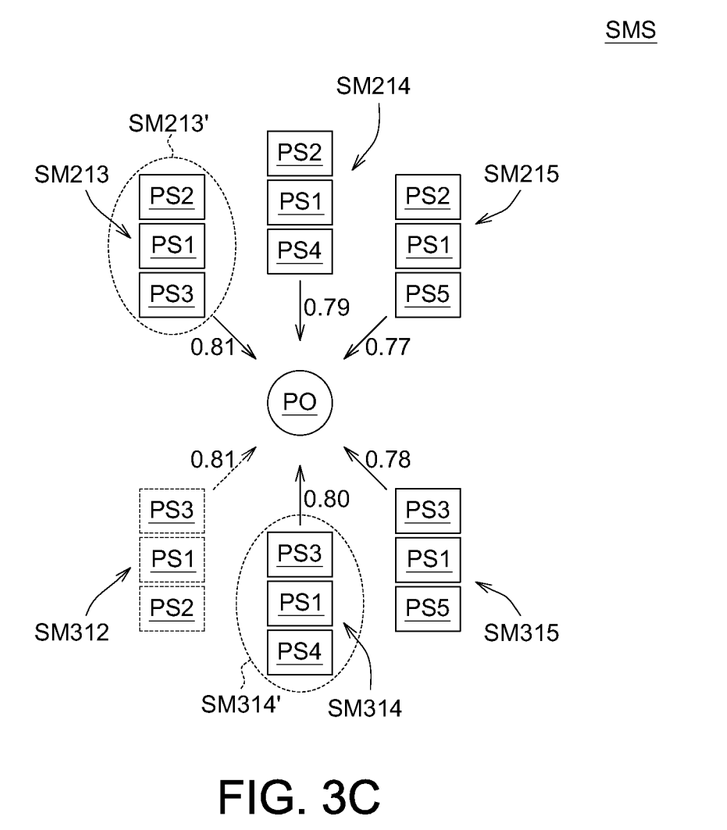

Afterwards, in step S160, as shown in FIG. 3C, the step model set SMS is updated by a plurality of step regression model SM213, SM214, SM215, SM312, SM314, SM315. The step regression model SM213 represents a relationship between the process steps PS2, PS1, PS3 and the process output PO. The step regression model SM214 represents a relationship between the process steps PS2, PS1, PS4 and the process output PO. The step regression model SM215 represents a relationship between the process steps PS2, PS1, PS5 and the process output PO. The step regression model SM312 represents a relationship between the process steps PS3, PS1, PS2 and the process output PO. The step regression model SM312 is similar to the step regression model SM213, so the step regression model SM312 is omitted. The step regression model SM314 represents a relationship between the process steps PS3, PS1, PS4 and the process output PO. The step regression model SM315 represents a relationship between the process steps PS3, PS1, PS5 and the process output PO.

In step S130, the processor calculates a correlation of each of the step regression models SM213, SM214, SM215, SM314, SM315. Referring to table III, the correlations of the step regression models SM213, SM214, SM215, SM314, SM315 are shown.

TABLE III

| Step regression model | Process steps | R-squared value | Rank | Pick up? |
|---|---|---|---|---|
| SM213 | PS2 PS1 PS3 | 0.81 | 1 | Yes |
| SM214 | PS2 PS1 PS4 | 0.79 | 3 | No |
| SM215 | PS2 PS1 PS5 | 0.77 | 5 | No |
| SM314 | PS3 PS1 PS4 | 0.80 | 2 | Yes |
| SM315 | PS3 PS1 PS5 | 0.78 | 4 | No |

Next, in step S140, the convergence condition is not satisfied, so the process proceeds to step S150 again.

Then, in step S150, as shown in FIG. 3C, the processor picks up two step regression models SM213', SM314'. The correlations of the step regression models SM213', SM314' are ranked at top among the correlations of the step regression models SM213, SM214, SM215, SM314, SM315.

Figure 3D:
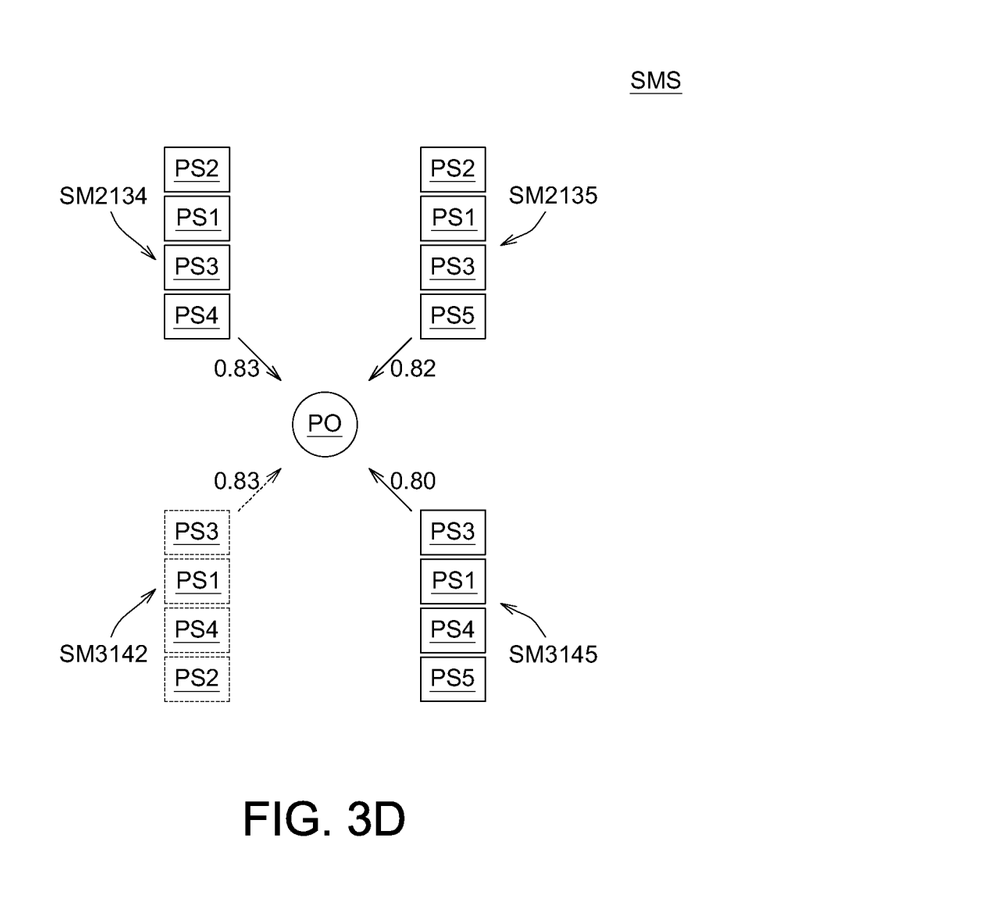

Afterwards, in step S160, as shown in FIG. 3D, the step model set SMS is updated by a plurality of step regression models SM2134, SM2135, SM3142, SM3145. The step regression model SM2134 represents a relationship between the process steps PS2, PS1, PS3, PS4 and the process output PO. The step regression model SM2135 represents a relationship between the process steps PS2, PS1, PS3, PS5 and the process output PO. The step regression model SM3142 represents a relationship between the process steps PS3, PS1, PS4, PS2 and the process output PO. The step regression model SM3142 is similar to the step regression model SM2134, so the step regression model SM3142 is omitted here. The step regression model SM3145 represents a relationship between the process steps PS3, PS1, PS4, PS5 and the process output PO.

In step S130, the processor calculates a correlation of each of the step regression models SM2134, SM2135, SM3145. Referring to table IV, the correlations of the step regression models SM2134, SM2135, SM3145 are shown.

TABLE IV

| Step regression model | Process steps | R-squared value |
|---|---|---|
| SM2134 | PS2 PS1 PS3 PS4 | 0.83 |
| SM2135 | PS2 PS1 PS3 PS5 | 0.82 |
| SM3145 | PS3 PS1 PS4 PS5 | 0.80 |

Next, in step S140, the convergence condition is satisfied, so the process is terminated. At the end, the step model set SMS including the step regression models SM2134, SM2135, SM3145 is obtained. The engineer may select one (or two) of the step regression models SM2134, SM2135, SM3145 to found the key process steps.

Base on above, in the method for analyzing the process output which is a semi best subset (SBS) algorithm, at least two of the first step regression models are picked up, such that some essential step regression models will not be ignored. Further, not all of the first step regression models are picked up, so the computational complexity is not too high. Especially in the semiconductor process, even if the number of the process steps is quite large, the key process steps still can be found by performing this disclosed method.

Second Embodiment

Figure 4:
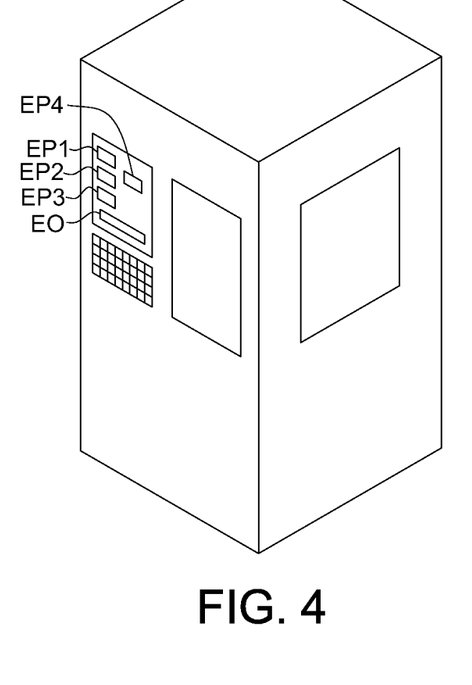
FIG. 4 shows an exemplified equipment.

Please refer to FIG. 4, which shows an exemplified equipment. For performing a particular process step, a lot of equipment parameters of this equipment are needed to be set. In this simplified example, four equipment parameters EP1, EP2, EP3, EP4 are needed to be set. After the process step is performed, an equipment output EO is obtained. For example, each of the equipment parameters EP1, EP2, EP3, EP4 may be a temperature, an execution time, a pressure, a voltage, a current, a concentration or a material. The equipment output EO may be a thickness, a critical dimension, a resistance or a flatness level.

Figure 5:
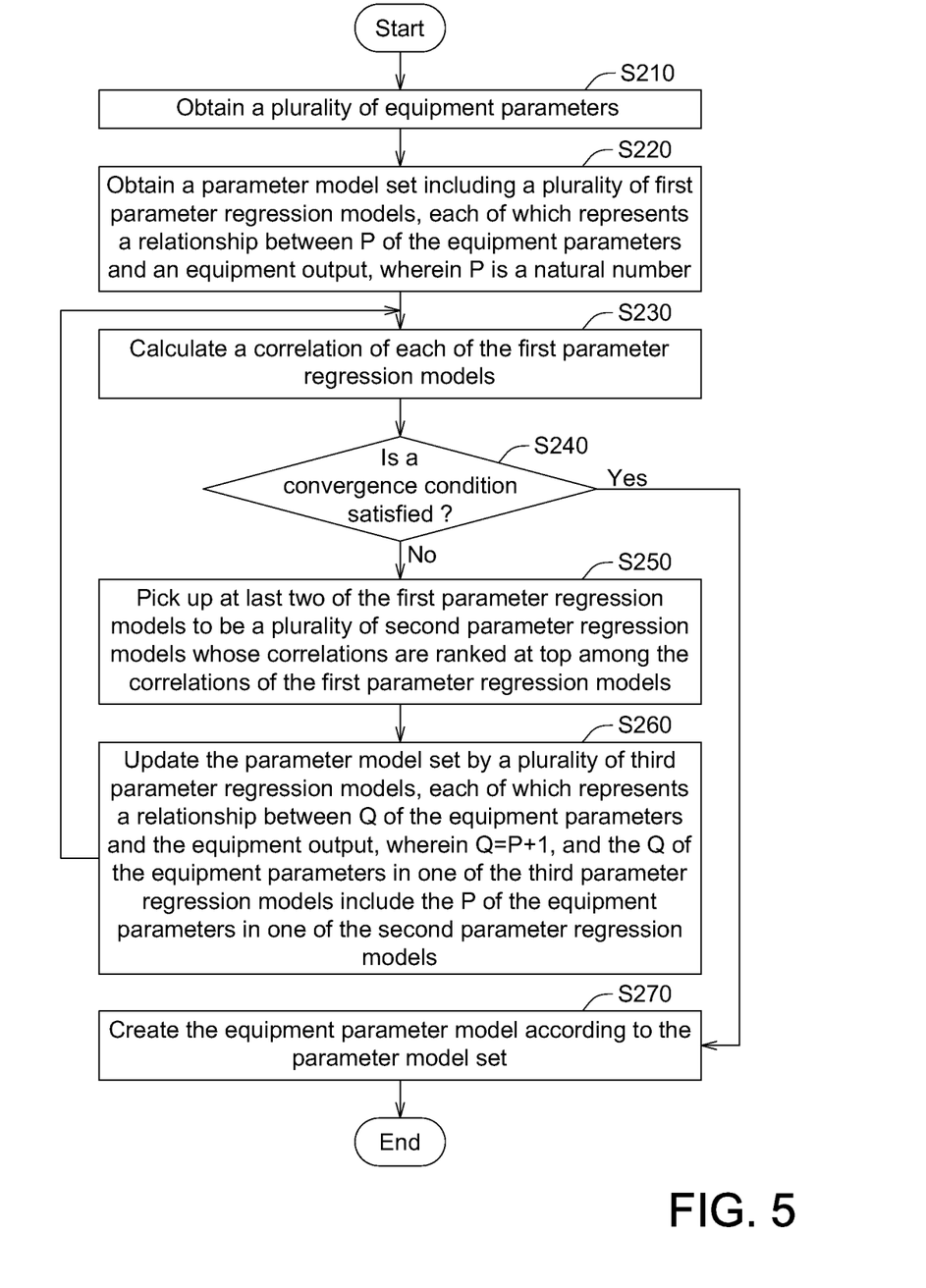
FIG. 5 shows a flowchart of method for creating an equipment parameter model according to a second embodiment of the present invention.
Figure 6A:
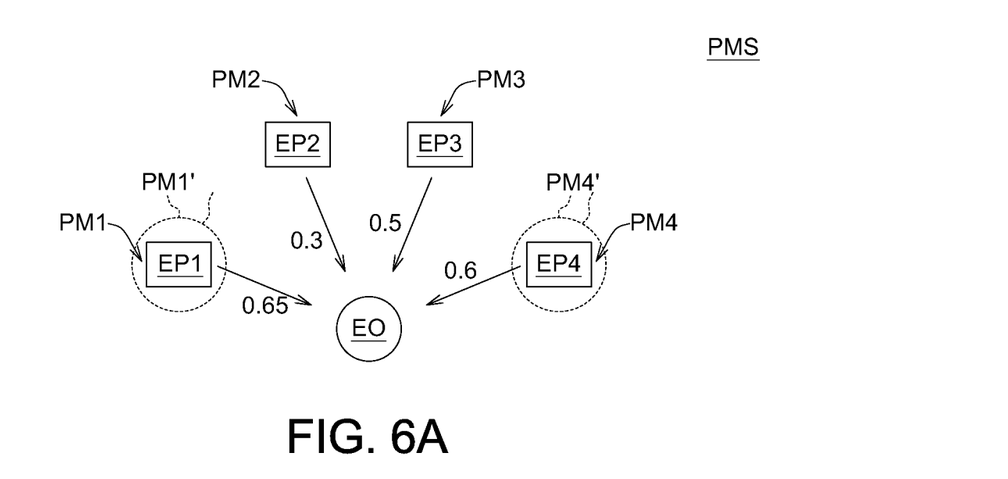
FIGS. 6A to 6C illustrate steps of FIG. 5.
Figure 6B:
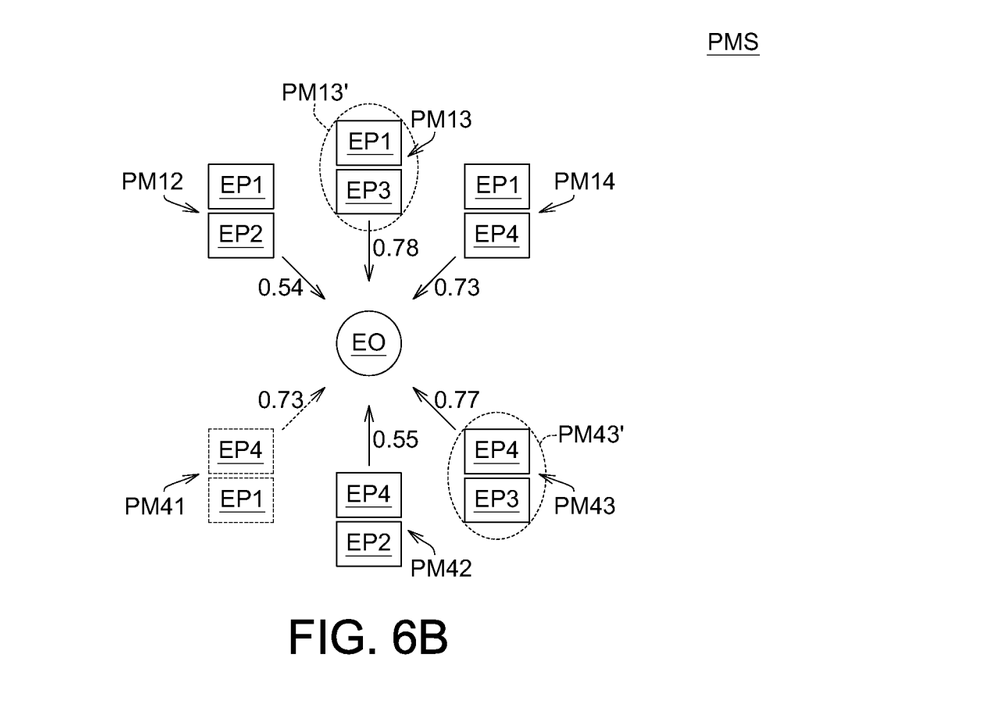
Figure 6C:
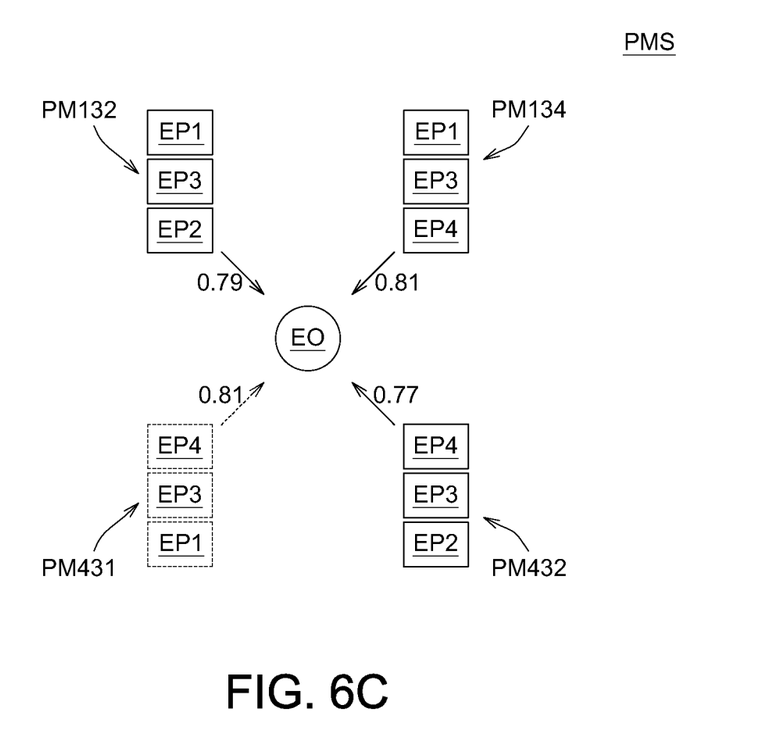

Please refer to FIG. 5 and FIGS. 6A to 6C. FIG. 5 shows a flowchart of method for creating an equipment parameter model according to the second embodiment of the present invention. FIGS. 6A to 6C illustrate the steps of FIG. 5. In this embodiment, the method for creating the equipment parameter model is a semi best subset (SBS) algorithm.

In step S210, a plurality of equipment parameters are obtained from a database or an inputting device. As shown in FIG. 4, the equipment parameters EP1, EP2, EP3, EP4 are obtained.

Next, in step S220, a processor obtains a parameter model set including a plurality of first parameter regression models. As shown in FIG. 6A, the processor obtains a parameter model set PMS including a plurality of parameter regression models PM1, PM2, PM3, PM4. The parameter regression model PM1 represents a relationship between the equipment parameter EP1 and the equipment output EO. The parameter regression model PM2 represents a relationship between the equipment parameter EP2 and the equipment output EO. The parameter regression model PM3 represents a relationship between the equipment parameter EP3 and the equipment output EO. The parameter regression model PM4 represents a relationship between the equipment parameter EP4 and the equipment output EO.

Afterwards, in step 230, the processor calculates a correlation of each of the first parameter regression models. In this example, the processor calculates a correlation of each of the parameter regression models PM1, PM2, PM3, PM4. For example, each of the correlations may be a R-squared value, an adjusted R-squared value, a Mallow' Cp statistic value or a P-value. Referring to table V, the correlations of the parameter regression models PM1, PM2, PM3, PM4, PM5 are shown.

TABLE V

| Parameter regression model | Equipment parameter | R-squared value | Rank | Pick up? |
|---|---|---|---|---|
| PM1 | EP1 | 0.65 | 1 | Yes |
| PM2 | EP2 | 0.30 | 4 | No |
| PM3 | EP3 | 0.50 | 3 | No |
| PM4 | EP4 | 0.60 | 2 | Yes |

Afterwards, in step S240, the processor determines whether a convergence condition is satisfied. If the convergence condition is satisfied, then the process proceeds to step S270; if the convergence condition is not satisfied, then the process proceeds to step S250. That is to say, the step S250, the step S260 and the step S230 are repeatedly performed until the convergence condition is satisfied.

In one embodiment, the convergence condition is that a variation of the correlations is less than a predetermined value.

As shown in FIG. 6A, the convergence condition is not satisfied. So, the process proceeds to step S250.

Then, in step S250, the processor picks up at least two of the first parameter regression models to be a plurality of second parameter regression models. As shown in FIG. 6A, the processor picks up two parameter regression models PM1', PM4'. The correlations of the parameter regression models PM1', PM4' are ranked at top among the correlations of the parameter regression models PM1, PM2, PM3, PM4.

In this example, the correlations of the parameter regression models PM1', PM4' are ranked at top predetermined percentage or top predetermined number, such as two, among the correlations of the parameter regression models PM1, PM2, PM3, PM4. The predetermined percentage and the predetermined number may be set according to the correlations of the parameter regression models PM1, PM2, PM3, PM4.

In step S260, the processor updates the parameter model set by a plurality of third parameter regression models. As shown in FIG. 6B, the parameter model set PMS is updated by a plurality of parameter regression models PM12, PM13, PM14, PM41, PM42, PM43. The parameter regression model PM12 represents a relationship between the equipment parameters EP1, EP2 and the equipment output EO. The parameter regression model PM13 represents a relationship between the equipment parameters EP1, EP3 and the equipment output EO. The parameter regression model PM14 represents a relationship between the equipment parameters EP1, EP4 and the equipment output EO. The parameter regression model PM41 represents a relationship between the equipment parameters EP4, EP1 and the equipment output EO. The parameter regression model PM41 is similar to the parameter regression model PM14, so the parameter regression model PM41 is omitted here. The parameter regression model PM42 represents a relationship between the equipment parameters EP4, EP2 and the equipment output EO. The parameter regression model PM43 represents a relationship between the equipment parameters EP4, EP3 and the equipment output EO.

In one example, the number of the equipment parameters may be quite large, so the parameter model set may be just updated by part of the third parameter regression models. In the step S260, the third parameter regression models may be sequentially formed until a stopping condition is satisfied. Then, the step model set is updated by the third parameter regression models which are already formed.

Then, in step S230, as shown in table VI, the processor calculates a correlation of each of the parameter regression model PM12, PM13, PM14, PM42, PM43.

TABLE VI

| Parameter regression model | Equipment parameter | R-squared value | Rank | Pick up? |
|---|---|---|---|---|
| PM12 | EP1 EP2 | 0.54 | 5 | No |
| PM13 | EP1 EP3 | 0.78 | 1 | Yes |
| PM14 | EP1 EP4 | 0.73 | 3 | No |
| PM42 | EP4 EP2 | 0.55 | 4 | No |
| PM43 | EP4 EP3 | 0.77 | 2 | Yes |

Next, in step S240, the convergence condition is not satisfied, so the process proceeds to step S250 again.

Then, in step S250, as shown in FIG. 6B, the processor picks up two parameter regression models PM13', PM43'. The correlations of the parameter regression models PM13', PM43' are ranked at top among the correlations of the parameter regression models PM12, PM13, PM14, PM42, PM43.

Afterwards, in step S260, as shown in FIG. 6C, the parameter model set PMS is updated by a plurality of parameter regression model PM132, PM134, PM431, PM432. The parameter regression model PM132 represents a relationship between the equipment parameters EP1, EP3, EP2 and the equipment output EO. The parameter regression model PM134 represents a relationship between the equipment parameters EP1, EP3, EP4 and the equipment output EO. The parameter regression model PM431 represents a relationship between the equipment parameters EP4, EP3, EP1 and the equipment output EO. The parameter regression model PM431 is similar to the parameter regression model PM134. So the parameter regression model PM431 is omitted here. The parameter regression model PM432 represents a relationship between the equipment parameters EP4, EP3, EP2 and the equipment output EO.

In step S230, the processor calculates a correlation of each of the parameter regression models PM132, PM134, PM432. Referring to table VII, the correlations of the parameter regression models PM132, PM134, PM432 are shown.

TABLE VII

| Parameter regression model | Equipment parameter | R-squared value |
|---|---|---|
| PM132 | EP1 EP3 EP2 | 0.79 |
| PM134 | EP1 EP3 EP4 | 0.81 |
| PM432 | EP4 EP3 EP2 | 0.77 |

Next, in step S240, the convergence condition is satisfied, so the process proceeds to step S270.

In step S270, the processor creates the equipment parameter model according to the parameter model set. As shown in FIG. 6C, the parameter model set PMS including the parameter regression models PM132, PM134, PM432 is obtained. The engineer may combine the parameter regression models PM132, PM134, PM432 to create the equipment parameter model.

Base on above, in the method for creating the equipment parameter model which is a semi best subset (SBS) algorithm, at least two of the first parameter regression models are picked up, such that some essential parameter regression models will not be ignored. Further, not all of the first parameter regression models are picked up, so the computational complexity is not too high. Especially in the semiconductor equipment, even if the number of the equipment parameters is quite large, the equipment parameter model still can be created by performing this disclosed method.

Third Embodiment

Figure 7:
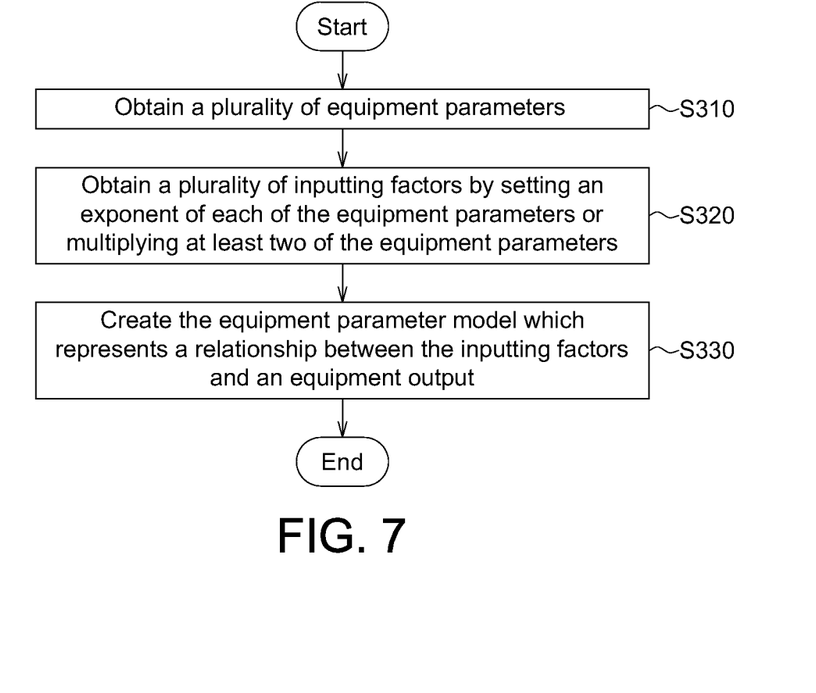
FIG. 7 shows a flowchart of method for creating an equipment parameter model according to a third embodiment of the present invention.
Figure 8:
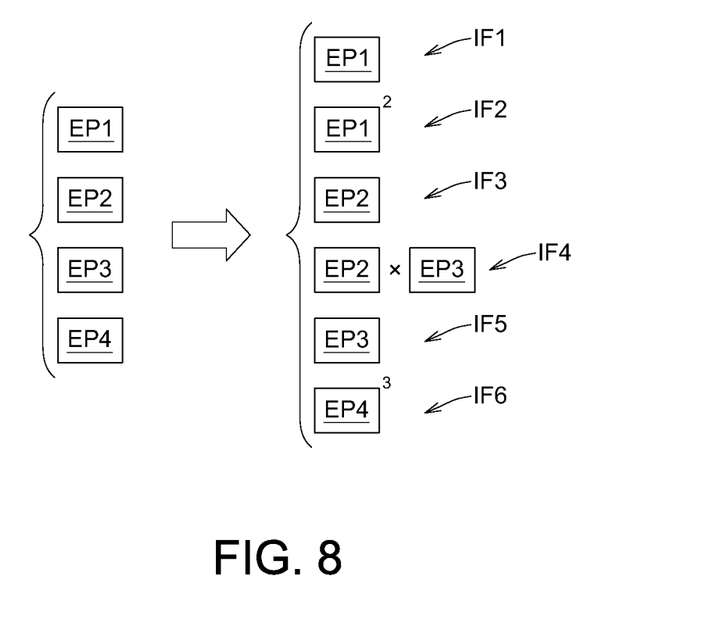
FIG. 8 illustrates steps of FIG. 7.

Please refer to FIG. 7 and FIG. 8. FIG. 7 shows a flowchart of method for creating an equipment parameter model according to the third embodiment of the present invention. FIG. 8 illustrates the steps of FIG. 7.

In step S310, a plurality of equipment parameters are obtained from a database or an inputting device. As shown in FIG. 8, the equipment parameters EP1, EP2, EP3, EP4 are obtained. For example, each of the equipment parameters EP1, EP2, EP3, EP4 may be a temperature, a process time, a pressure, a flow, a voltage, a current, a power, a force, a concentration, a ratio, a rate, a distance, a material or a life time.

In step S320, a processor obtains a plurality of inputting factors by setting an exponent of each of the equipment parameters or multiplying at least two of the equipment parameters. As shown in FIG. 8, a plurality of inputting factors IF1 to IF6 are obtained. The inputting factor IF1 and the inputting factor IF2 are obtained by setting the exponent of the equipment parameter EP1 to be 1 and 2 respectively. The inputting factor IF3 is obtained by setting the exponent of the equipment parameter EP2 to be 1. The inputting factor IF4 is obtained by multiplying the equipment parameter EP2 and equipment parameter EP3. The inputting factor IF5 is obtained by setting the exponent of the equipment parameter EP3 to be 1. The inputting factor IF6 is obtained by setting the exponent of the equipment parameter EP4 to be 3.

In step S330, the processor creates the equipment parameter model which represents a relationship between the inputting factors IF1 to IF8 and an equipment output. For example, the equipment output may be a thickness, a thickness difference, a time, a rate, a critical dimension, a distance, a resistance, a flatness level or a count.

Base on above, in the method for creating the equipment parameter model, the inputting factors are obtained by setting the exponent of each of the equipment parameters or multiplying at least two of the equipment parameters, such that the equipment parameter model can be more accurate.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A method for analyzing a process output, comprising:
    obtaining a plurality of process steps from a database or an inputting device;
    creating, by a processor, a step model set including a plurality of first step regression models, each of which represents a relationship between N of the process steps and a process output, wherein N is a natural number and equal to or larger than 2, and the step model set including the first step regression models, whose size is larger than 2, is stored in a memory;
    calculating, by the processor, a correlation of each of the first step regression models, each of which represents the relationship between at least two of the process steps and the process output;
    picking up, by the processor, at least two of the first step regression models to be two second step regression models whose correlations are ranked at top among the correlations of the first step regression models, wherein each of the correlations used for picking up two of the first step regression models is calculated through at least two of the process steps, and the step model set stored including only the two second step regression models, whose size is 2, is stored in the memory; and
    updating, by the processor, the step model set by creating a plurality of third step regression models, each of which represents a relationship between M of the process steps and the process output, wherein M=N+1, and the M of the process steps in one of the third step regression models include the N of the process steps in one of the second step regression models, and the step model set stored including the third step regression models, whose size is larger than 2, is stored in the memory;

wherein the step of picking up the two of the first step regression models, the step of updating the step model set and the step of calculating the correlations are repeatedly performed until a convergence condition is satisfied;

a size of the step model set stored in the memory is increased and decreased alternately.

2. The method for analyzing the process output according to claim 1, wherein in each of the process steps, an apparatus, a procedure, a chamber or a recipe is set.

3. The method for analyzing the process output according to claim 1, wherein the process output is a yield rate, a critical dimension, a defect value, an inspection, a metrology, a monitor data of wafer or equipment, a result of Wafer Acceptance Test (WAT) or at least one item of the WAT.

4. The method for analyzing the process output according to claim 1, wherein each of the correlations of the first step regression models is a R-squared value, an adjusted R-squared value, a Mallow' Cp statistic value or a P-value.

5. The method for analyzing the process output according to claim 1, wherein the correlations of the second step regression models are ranked at top predetermined percentage among the correlations of the first step regression models.

6. The method for analyzing the process output analyzing according to claim 5, wherein the predetermined percentage is set according to the correlations of the first step regression models.

7. The method for analyzing the process output according to claim 1, wherein the correlations of the second step regression models are ranked at top predetermined number among the correlations of the first step regression models.

8. The method for analyzing the process output analyzing according to claim 7, wherein the predetermined number is set according to the correlations of the first step regression models.

9. The method for analyzing the process output according to claim 1, wherein the step of updating the step model set includes:

sequentially forming the third step regression models until a stopping condition is satisfied; and updating the step model set by the third step regression models which are already formed.

10. The method for analyzing the process output according to claim 1, wherein the convergence condition is that a variation of the correlations of the first step regression models is less than a predetermined value.

11. A method for creating an equipment parameter model, comprising:

obtaining a plurality of equipment parameters from a database or an inputting device;

creating, by a processor, a parameter model set including a plurality of first parameter regression models, each of which represents a relationship between P of the equipment parameters and an equipment output, wherein P is a natural number and equal to or larger than 2, and the step model set including the first step regression models, whose size is larger than 2, is stored in a memory;

calculating, by the processor, a correlation of each of the first parameter regression models, each of which represents the relationship between at least two of the equipment parameters and the equipment output;

picking up, by the processor, two of the first parameter regression models to be two second parameter regression models whose correlations are ranked at top among the correlations of the first parameter regression models, wherein each of the correlations used for picking up two of the first parameter regression models is calculated through at least two of the equipment parameters, and the step model set stored including only the two second step regression models, whose size is 2, is stored in the memory;

updating, by the processor, the parameter model set by creating a plurality of third parameter regression models, each of which represents a relationship between Q of the equipment parameters and the equipment output, wherein Q=P+1, and the Q of the equipment parameters in one of the third parameter regression models include the P of the equipment parameters in one of the second parameter regression models, and the step model set stored including the third step regression models, whose size is larger than 2, is stored in the memory; and creating, by the processor, the equipment parameter model according to the parameter model set;

wherein the step of picking up the two of the first parameter regression models, the step of updating the parameter model set and the step of calculating the correlations are repeatedly performed until a convergence condition is satisfied;

a size of the step model set stored in the memory is increased and decreased alternately.

12. The method for creating the equipment parameter model according to claim 11, wherein each of the equipment parameters is a temperature, an execution time, a pressure, a voltage, a current, a concentration or a material.

13. The method for creating the equipment parameter model according to claim 11, wherein the equipment output is a thickness, a critical dimension, a resistance, or a flatness level.

14. The method for creating the equipment parameter model according to claim 11, wherein each of the correlations of the first parameter regression models is a R-squared value, an adjusted R-squared value, a Mallow' Cp statistic value or a P-value.

15. The method for creating the equipment parameter model according to claim 11, wherein the correlations of the second parameter regression models are ranked at top predetermined percentage among the correlations of the first parameter regression models.

16. The method for creating the equipment parameter model according to claim 15, wherein the predetermined percentage is set according to the correlations of the first parameter regression models.

17. The method for creating the equipment parameter model according to claim 15, wherein the correlations of the second parameter regression models are ranked at top predetermined number among the correlations of the first parameter regression models.

18. The method for creating the equipment parameter model according to claim 17, wherein the predetermined number is set according to the correlations of the first parameter regression models.

19. The method for creating the equipment parameter model according to claim 11, wherein the step of updating the parameter model set by the third parameter regression models includes:

sequentially forming the third parameter regression models until a stopping condition is satisfied; and updating the parameter model set by the third parameter regression models which are already formed.

20. The method for creating the equipment parameter model according to claim 11, wherein the convergence condition is that a variation of the correlations of the first parameter regression models is less than a predetermined value.

* * * * *